United States Patent
Heid

(10) Patent No.: US 7,279,894 B2
(45) Date of Patent: Oct. 9, 2007

(54) METHOD AND MAGNETIC RESONANCE TOMOGRAPHY APPARATUS FOR LOCATION CODING WITH A NON-LINEAR GRADIENT FIELD

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 699 days.

(21) Appl. No.: 10/105,692

(22) Filed: Mar. 25, 2002

(65) Prior Publication Data

US 2002/0147395 A1 Oct. 10, 2002

(30) Foreign Application Priority Data

Apr. 6, 2001 (DE) ................. 101 17 342

(51) Int. Cl.
*G01V 3/00* (2006.01)
(52) U.S. Cl. ............... 324/309; 324/307; 600/410; 600/407
(58) Field of Classification Search ............... 324/307, 324/309; 600/410, 407
See application file for complete search history.

(56) References Cited

U.S. PATENT DOCUMENTS 5,539,312 A * 7/1996 Fu et al. ................. 324/309
6,469,505 B1 * 10/2002 Maier et al. ............. 324/309
6,509,735 B2 * 1/2003 Mueller et al. .......... 324/307
6,559,641 B2 * 5/2003 Thesen ..................... 324/307
6,801,034 B2 * 10/2004 Brittain et al. ........... 324/309
2001/0048306 A1 * 12/2001 Mueller et al. .......... 324/334

OTHER PUBLICATIONS

"Artifacts Induced by Concomitant Magnetic Field in Fast Spin-Echo Imaging," Zhou et al. Magnetic Resonance in Medicine, vol. 40 (1998), pp. 582-591.

* cited by examiner

Primary Examiner—Brian L Casler
Assistant Examiner—John F Ramirez
(74) Attorney, Agent, or Firm—Schiff Hardin LLP

(57) ABSTRACT

A nuclear magnetic resonance tomography apparatus has gradient coils that superimpose at least one gradient field on a basic magnetic field transversely to a coding direction, with an overall magnetic field in the coding direction having a magnetic field strength with a component that changes quadratically over distance. A support mechanism displaces a subject to be measured by a distance $\Delta w$ in the coding direction, and a control computer determines an absolute location w of a nuclear magnetic resonance signal in the coding direction from the resulting, quadratically dependent phase differences or resonant frequency differences during the displacement of the subject.

14 Claims, 2 Drawing Sheets

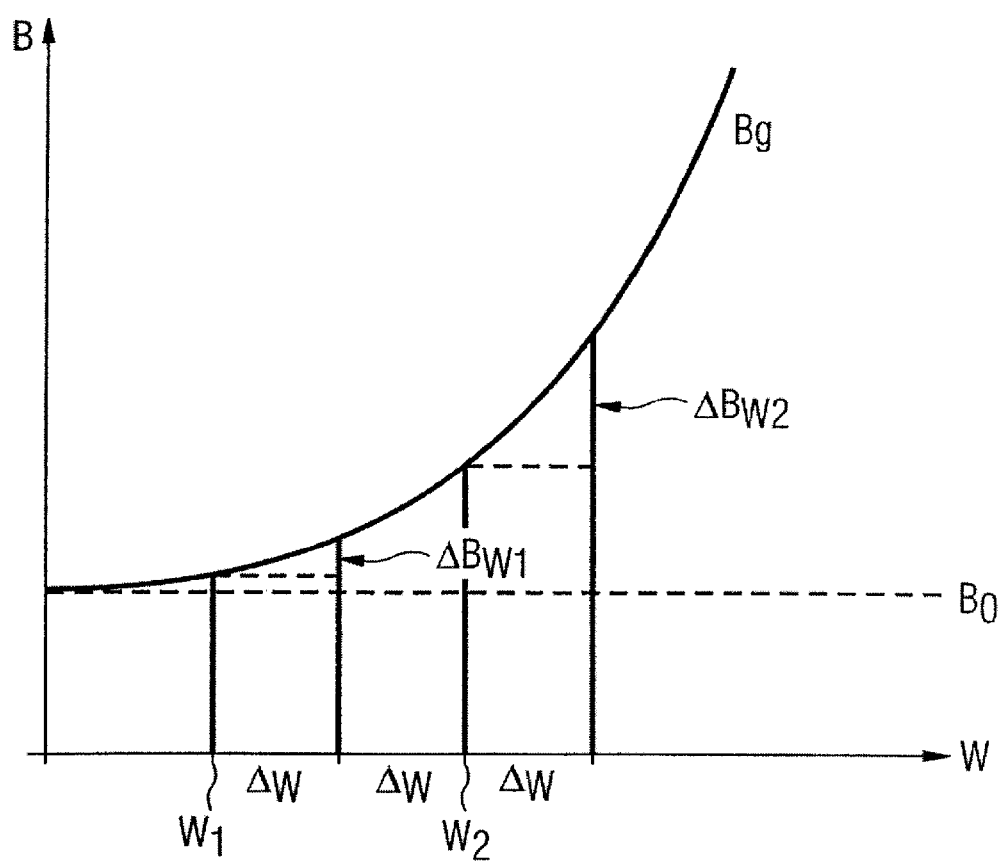

METHOD AND MAGNETIC RESONANCE TOMOGRAPHY APPARATUS FOR LOCATION CODING WITH A NON-LINEAR GRADIENT FIELD

BACKGROUND OF THE INVENTION

1. Field of the Invention

The present invention is directed in general to a magnetic resonance tomography apparatus and to a method wherein a non-linear gradient field is superimposed on a basic magnetic field transversely to a coding direction and a location coding ensues by moving a subject in this coding direction. In particular, the present invention is directed to a magnetic resonance tomography apparatus and to a method wherein it is possible to acquire absolute location information from a relative motion of a subject by a specific distance in a coding direction.

2. Description of the Prior Art

Magnetic resonance tomography is a method for medical diagnostics that makes it possible to display structures of the human body overall and in detail. Nuclear spins of the nuclei are aligned in a region under examination in a subject due to a strong, externally applied magnetic field. Statistically distributed, the nuclear spins align in specific energy levels. When energy is supplied by means of a radio-frequency pulse at a resonant frequency that is material-specific, the nuclear spins assume different energy levels. After the radio-frequency pulse is deactivated, the return onto the original energy level can be measured in the external magnetic field by receiving the energy emitted at the resonant frequency.

It is decisive for magnetic resonance tomography that this signal of the nuclear spins on the resonant frequency be able to be allocated to a location in the subject. To this end, phase coding or frequency coding is employed. A number of detailed, even combined applications are known for both methods in order to achieve a optimally precise location encoding under certain conditions, either in a specific volume element or a rod-shaped volume or a surface.

Frequency coding is based on the use of a gradient field that linearly decreases or rises in a coding direction that is superimposed on the basic magnetic field by which the nuclear spins are aligned. Since the resonant frequency of the nuclear spins—more precisely, the energy levels of the nuclear spins—exhibits a dependency on the intensity of the magnetic field, selection of a slice can ensue as a result. This slice is perpendicular to the direction in which the magnetic field decreases or rises linearly. The resonant frequency of a specific substance is linearly dependent via the constant γ—the gyromagnetic constant—on the magnetic field at the location of the nucleus. In magnetic resonance tomography, an examination usually is undertaken on the basis of the nuclear spins of hydrogen in order to obtain an image of the tissue distribution of a body segment under examination by virtue of their distribution. When the gradient field is superimposed on the basic magnetic field, those nuclear spins that exhibit the resonant frequency that corresponds to the magnetic field in this layer, via the gyromagnetic constant, can be received only at a specific frequency.

Such a gradient field is generated, for example, by two coils that each generate a magnetic field, the two magnetic fields being oppositely directed. A magnetic field that essentially linearly rises or falls relative to a spatial direction arises in a volume between the two coils. It is desirable to be able to image an optimally large measurement volume in a nuclear magnetic resonance tomography apparatus, so that an optimally large region of a subject to be measured can be covered at one time. When such a very large field of view (FOV) is desired, however, serious image disturbances or artifacts occur because the magnetic field no longer falls or rises with enough linear exactitude. Quadratic field inhomogeneities occur that are known as concomitant fields or Maxwell terms. The order of magnitude of these quadratic inhomogeneities for a gradient field transverse to the basic magnetic field can be estimated for the direction of the basic magnetic field, as the coding direction, as being proportional to the square of the magnetic field strength of the superimposed gradient field divided by twice the basic magnetic field times the location in the square. Leaving the contribution of this non-homogeneous field component out of consideration is even less possible when stronger gradient fields are employed, for example greater then 10 mT/m, as well as in systems wherein a lower basic magnetic field, for example less than 0.5 Tesla is employed. The correction or avoidance of artifacts and other image errors that are based on these effects therefore is becoming increasingly important. This problem area is discussed in the article by Zhou, Tan and Bernstein, "Artifacts induced by concomitant magnetic field and in fast spin-echo imaging" in Magnetic Resonance Medicine (MRM) 40.582-591 (1998).

The second previously mentioned, basic location coding method—phase coding—is based on the effect that, when an excited condition of a nuclear spin is subjected to a specific magnetic field and resonates with the corresponding resonant frequency, the phases of the excitation states of the nuclear spins (initially in phase) diverge when they are subjected to different magnetic fields in the same time span, and thus temporarily exhibit different resonant frequencies. Typical phase coding methods are consequently based exposing a region of the field of view to a gradient magnetic field and, consequently, the phases diverge location-dependently. Typically, this method is multiply implemented with gradient magnetic fields of different intensities in standard phase coding sequences. In order to keep the overall measuring time short, it is desirable to keep the time during which the gradient magnetic field is activated short, since, as noted, multiple repetitions are necessary. As a result thereof, however, the inhomogeneities of the field that have been discussed above have an especially pronounced effect and can no longer be left out of consideration, particularly in the phase coding.

By combining the above-described, basic location coding methods—either successively or in different spatial directions—as well as with a preceding selective excitation of only specific nuclear spins in a specific volume element, for example an area, a large variety of known coding methods are available. Given a larger field of view, a negative effect in all of these methods arises from the aforementioned quadratic field terms of the magnetic field intensity. These have a pronounced effect as discussed above particularly in those modern nuclear magnetic resonance apparatus that operate with a low basic magnetic field and those operating with strong gradient magnetic fields.

SUMMARY OF THE INVENTION

It is an object of the present invention to provide a magnetic resonance tomography apparatus and a method with which it is possible to effect simple and quickly implemented location coding given a large field of view and with nonhomogeneous field terms of the second order resulting therefrom.

This object is inventively achieved in a magnetic resonance tomography apparatus having gradient coils that superimpose at least one gradient field on a basic magnetic field transversely to a coding direction, with an overall magnetic field in the coding direction having a magnetic field strength with a component that changes quadratically over distance, and a bearing support mechanism that displaces a subject to be measured by a distance Δw in the coding direction. Using the resulting, quadratic change of the phases or resonant frequency differences during the displacement of the subject to be measured, a control computer determines an absolute location L of a nuclear magnetic resonance signal in the coding direction allocated to the phase or to the resonant frequency. The dependency on the square of distance enables a determination of the distance with reference to a zero point by making measurements once before the displacement and once after the displacement. A phase change is linearly dependent on the time during which the magnetic field influences the nuclear spin energy levels allocated to a specific location in the magnetic field. When the phase is then measured before and after a displacement by a known distance, then the absolute location can be determined therefrom and from the displacement by the known distance as well as the phase difference. The signal intensity can be allocated thereto. In a corresponding way, the absolute location can be determined from the frequency difference given measurement of a resonant frequency of a signal before the displacement and following the displacement.

Thus, location information can be acquired in a relatively simple way from a physical effect that is considered a disturbance in known prior art techniques, or prevents an exact measurement therewith. It is also advantageous that a mechanism and an apparatus for supporting and moving a subject to be measured, for example a patient, is already present in a conventional magnetic resonance tomography apparatus. This, consequently, need be adapted only to be able to implement adequately precise and small movements with adequate velocity and such that such movements can also be implemented in every coding direction.

In an embodiment, the coding direction in a magnetic resonance tomography apparatus is aligned in the direction of the basic magnetic field. The magnetic field thereby has a quadratic component of the second order that essentially corresponds to $G_r^2 w^2/2B_0$, with $G_r$ being the magnetic field strength of the transversely oriented gradient magnetic field in the first order, w designating location, and $B_0$ designating the basic magnetic field strength.

A magnetic resonance tomography apparatus having the inventive features can thereby implement location coding in the direction of the basic magnetic field and thereby exploit the effect of the Maxwell terms that is especially disturbing in the prior art, and that has an especially disturbing effect given a gradient magnetic field applied transversely relative to the basic magnetic field because of the large longitudinal extent in the direction of the basic magnetic field.

In a further embodiment, the resonance tomography apparatus has a gradient magnetic field oriented in a transverse direction relative to the basic magnetic field and has a support mechanism and a control computer that multiply displace the subject to be measured in the coding direction, which corresponds to the direction of the basic magnetic field, and thereby replace phase coding with a corresponding number of different gradient field in $N_z$ steps. After each displacement, an echo time $T_E$ is allowed to pass and a signal is identified from the phase differences of the location l corresponding to the equality: $N_z/\gamma w = G_r^2 w\, T_E/B_0$, wherein $\gamma$ is the gyromagnetic constant, which is a constant of the material to be detected, and $T_E$ is the echo time.

In another embodiment of the inventive magnetic resonance tomography apparatus has a control computer, with measurement cycles respectively having changing gradients of the magnetic field strength of the first order such as, for example, echo imaging, planar imaging or spiral imaging, corrects the shift of the locations w of the coding steps that occur due to the change of the quadratic magnetic field strength. Using additional measurements, the control computer interpolates or determines the measured values that correspond to the unshifted locations w of the coding steps.

The mathematical evaluation methods of nuclear magnetic resonance tomography usually are based on a signal value being available in a raster in topically equidistant points. In such methods, however, the magnetic field strength of the first order of the gradient field changes given forward progress, for example on a trajectory or a spatial path. This, however, also leads to a change of the quadratic terms as to homogeneity, since these can be described by an estimate that contains the gradient field strength of the first order. The measurement thus ensues at a spatially deviating location w'. It is therefore beneficial to either interpolate the missing point or to determine it with a further measurement.

In an inventive method for location coding, a gradient field is superimposed on a basic magnetic field transversely relative to a coding direction in a magnetic resonance tomography apparatus, and the overall magnetic field in the coding direction has a magnetic field strength with a component that changes quadratically over distance. In a first step, the phases and/or frequencies of the nuclear spins are measured in the measurement volume. The subject to be measured is then displaced by a distance in the coding direction, and the phases and/or frequencies of the nuclear spins are measured again in the measurement volume. The absolute location w for a measured signal of the phase and/or frequency is determined from the dependency of the difference of the phase and/or frequency relative to the component of the magnetic field that is quadratically dependent on w.

The inventive method exhibits the same advantages as the inventive magnetic resonance tomography apparatus discussed above.

In an embodiment of the method, the coding direction is oriented in the direction of the basic magnetic field. The quadratic component of the second order in the coding direction essentially corresponds to $G_r^2 w^2/2B_0$, wherein $G_r$ is the magnetic field strength of the gradient magnetic field of the first order, w designed as location, and $B_0$ designates the field strength of the basic magnetic field.

The phase coding—with a coding direction in the direction of the basic magnetic field—ensues with the steps that an echo time $T_E$ being first allowed to pass after the displacement of the subject to be measured. The location w of a signal is then determined from the phase differences, using the equality $N_z/\gamma w = G_r^2 w\, TE/B_0$ wherein $\gamma$ is the gyromagnetic constant and $N_z$ is the number of previous steps. The method is again iteratively implemented in a step $N_z = N_z + 1$.

These method steps also exhibit the advantages of the corresponding embodiments of the magnetic resonance tomography apparatus that have already been presented.

It is advantageous in the inventive method for location coding when, given measurement cycles with changing magnetic fields of the first order, such as echo planar imaging or spiral imaging, with non-equidistant coding steps arising therefrom, for measured values corresponding to the equidistant coding steps being interpolated or determined by additional measurements.

DESCRIPTION OF THE DRAWINGS

FIG. 2 schematically shows a curve of the overall magnetic field strength with displacements for explaining the invention.

DESCRIPTION OF THE PREFERRED EMBODIMENTS

Figure 1:
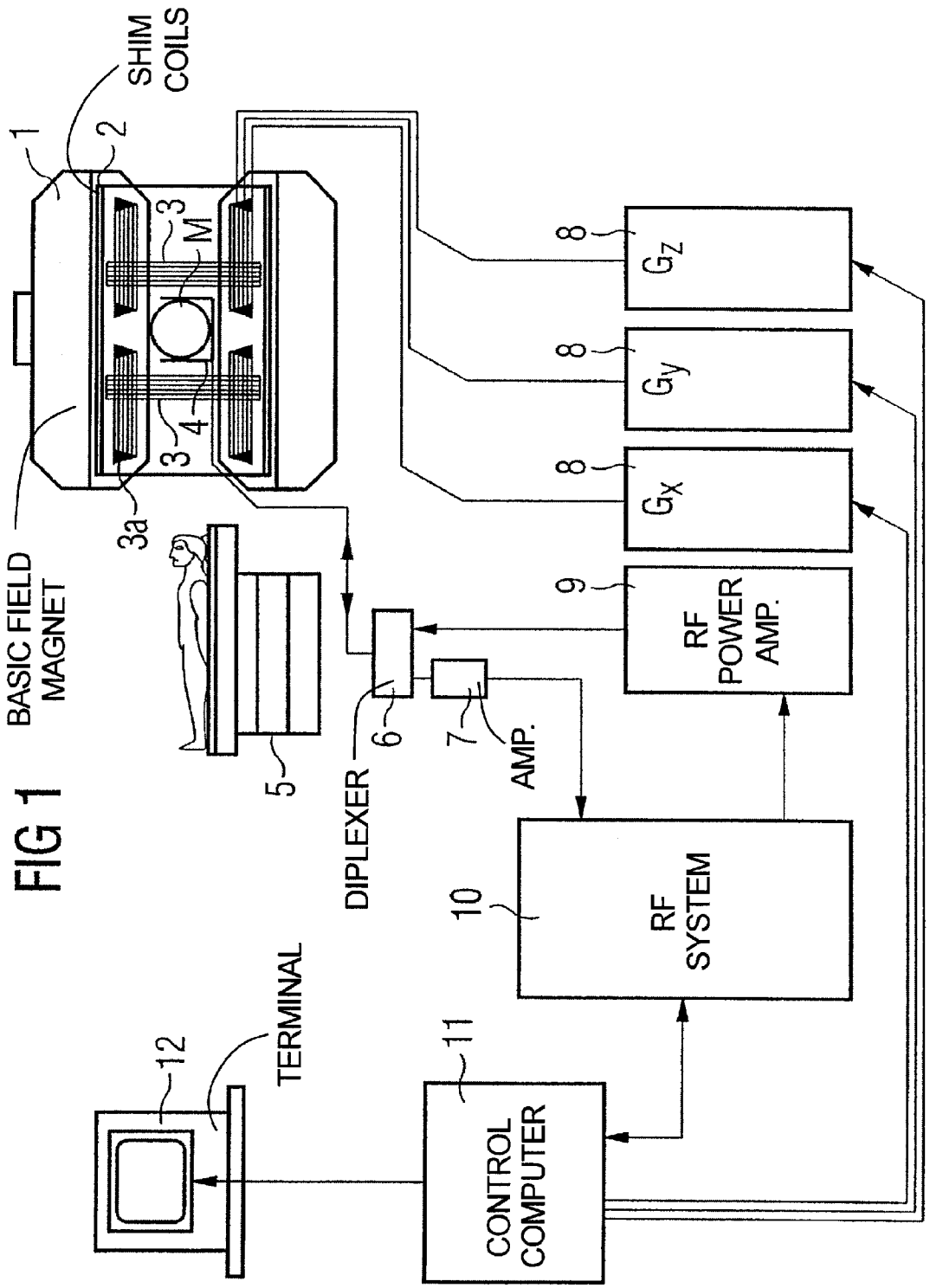
FIG. 1 schematically illustrates a magnetic resonance tomography apparatus operable in accordance with the invention.

FIG. 1 shows the basic components of a magnetic resonance tomography apparatus, corresponding to a conventional nuclear magnetic resonance tomography apparatus but differing by being operable in accordance with the invention. A basic field magnet 1 generates a strong, optimally uniform magnetic field for polarizing the nuclear spins in an examination region, which is designated as a measurement volume M, in the interior of the basic field magnet 1. The high homogeneity of the basic magnetic field required for a magnetic resonance measurement is principally defined in this spherical measurement volume M. Via a support mechanism 5, a person can be moved into the inside of the basic field magnet 1, so that the region of the human body that is to be examined is located within the measurement volume M. Further, the support mechanism 5 is implemented such that the subject to be measured can be moved in very exactly defined, small distances.

Time-invariable inhomogeneities of the basic magnetic field are corrected by shim plates of ferromagnetic material. Time-variable influences and modifications of the magnetic field are countered by shim coils 2. A cylindrical gradient coil system 3, 3a is introduced into the basic field magnet 1 and is composed of partial windings (sub-coils). Each partial winding is supplied with current by an amplifier 8 for generating a linear gradient field in the respective directions of a Cartesian coordinate system. In particular, gradient coils 3a are provided that generate gradient fields transversely relative to the direction of the basic field magnet, and thus generate a magnetic field in the direction of the basic field magnet 1 as the coding direction that has a quadratic component. Overall, gradient coils 3, 3a are present for gradient fields in all three coordinate directions of the Cartesian coordinate system. As a result of these gradient fields, it is possible to select the volume to be measured in a phase coding or frequency coding sequence.

A radio-frequency antenna 4, which converts radio-frequency pulses supplied by a radio-frequency power amplifier 9 via a transmission/reception diplexer 6 into an alternating magnetic field for exciting the nuclei and aligning the nuclear spins of the examination subject, is arranged within the gradient coil system 3, 3a. The alternating field emanating from the precessing nuclear spins is converted into a signal by the radio-frequency antenna 4, this signal being supplied to a radio-frequency system 10 via the transmission/reception diplexer 6 as well as an amplifier 7. The execution of the individual measurement sequences, as well as the drive of the support mechanism 5 (when this is to be displaced in small steps for phase coding), are controlled by a control computer 11, and an image is generated in this control computer 11 from the measured data that are acquired. The control computer 11 also implements the administration of the image data and the interpretation of the image data from various points of view. Using either the volume-related, line-related and/or area-related allocation of the signals to a specific location, an image is acquired in the control computer 11 by mathematical procedures. These, in particular, are Fourier methods. These images, which correspond to a three-dimensional presentation or a tomographic presentation, are presented to the user at a terminal 12 that has a keyboard as well as one or more picture screens. Via the terminal 12, a user can also control the nature and mode of the examination and of the nuclear magnetic resonance exposures.

FIG. 2 is a schematic diagram of the curve of the magnetic field strength of the overall magnetic field relative to distance, indicating the measuring locations w1 and w2, displacements $\Delta w$, and the appertaining changes of the overall magnetic field strengths $\Delta B_{w1}$ and $\Delta B_{w2}$. The horizontal axis shows the absolute location W and the vertical axis indicates the magnetic field strength B. In the embodiment that has been selected as an example, the overall magnetic field has a magnetic field strength $B_g$. The overall magnetic field $B_g$—leaving higher terms in the coding direction, the direction W, that corresponds to W, out of consideration—is composed of a component of the basic magnetic field $B_0$, which is entered as a broken line (not to scale), and is essentially constant. The difference compared to the illustrated overall gradient field $B_g$ then corresponds to a quadratic, non-homogeneous component in the coding direction w.

Two absolute locations w1 and w2 be considered below. In reality, the location coding can be based on a slice, a line or a narrowly prescribed volume element or voxel, dependent on whether a more narrowly limiting location selection is undertaken with the assistance of further location coding methods or further gradient fields oriented orthogonally. When the control computer 11 then undertakes a phase measurement and the subject to be measured is shifted by a distance $\Delta w$ by the support mechanism 5—toward the right in the direction W in FIG. 2 —, then another measurement can be undertaken at the shifted point. The result of the measurement is influenced with reference to phases by the changing field strength $\Delta B_{w1}$ and $\Delta B_{w2}$. Due to the inhomogeneity of the field, however, these differences are dependent on the location w1 or w2. In the selected exemplary embodiment, the difference amount of the magnetic field $\Delta B_{w2}$ to be allocated to w2 would be greater than the magnetic field difference $\Delta B_{w1}$ allocated to the measurement point w1, and the locations w1 and w2 can be identified from this difference based on the variation of the phase in the respective signals. $\Delta B_{w2}$ and $\Delta B_{w1}$ are composed of a term quadratically dependent on w.

In a phase coding method, it is standard in many versions to use a phase coding table wherein a number of successive gradient magnetic fields of different strengths are activated and an image evaluation mathematically ensues from the differences that occur. In the embodiment of the invention described here, it is possible to replace these different gradient magnetic fields with successive displacements by the same amount $\Delta w$. This is indicated by a number of such location differences $\Delta w$ being entered in FIG. 2. These are respectively able to be allocated according to their location, for example w1 and w2, as a result of the differences in their magnetic field strength that increase step-by-step. This is indicated by perpendicular lines relative to the overall magnetic field $B_g$. Advantageously, an inhomogeneity of a gradient magnetic field that cannot be avoided, or can only be avoided with substantial outlay, can be employed in the

I claim as my invention:

1. A magnetic resonance tomography apparatus comprising:
   a basic field magnet which generates a basic magnetic field in a basic magnetic field direction;
   gradient coils which superimpose at least one gradient magnetic field on said basic magnetic field transversely to a coding direction that coincides with said basic magnetic field direction, to produce an overall magnetic field in said coding direction having a magnetic field strength with a component changing quadratically over distance;
   a support mechanism adapted to receive an examination subject thereon, for displacing said subject by a distance $\Delta w$ in said coding direction in said overall magnetic field;
   a radio frequency system for exciting nuclear spins in said examination subject and for receiving magnetic resonance signals arising from said spins, each of said magnetic resonance signals having a phase and a resonant frequency; and
   a control computer supplied with said magnetic resonance signals that determines a quadratic change in at least one of differences in said phase and differences in said resonant frequency which occur due to said overall magnetic field component changing quadratically over distance during the displacement of said subject by said distance $\Delta w$, and that determines, from said quadratic change, an absolute location L of a magnetic resonance signal in said coding direction.

2. A magnetic resonance tomography apparatus as claimed in claim 1 wherein said control computer measures said quadratic change as a change of a quadratic component approximated by $G_r^2 w^2/2 B_0$, wherein $G_r$ is the magnetic field strength of the first order of the gradient magnetic field, w is location, and $B_0$ is the basic magnetic field strength.

3. A magnetic resonance tomography apparatus as claimed in claim 2 wherein said support mechanism successively displaces said subject and wherein said control computer implements phase coding by determining $N_z$ different measured values during the respective displacements of said subject, and controls said RF system so that, after each displacement, an echo time $T_E$ associated with said magnetic resonance signal is allowed to pass and the location w of the magnetic resonant signal is identified from said differences in said phase corresponding to $N_z/\gamma w = G_r^2 w T_E/B_0$, wherein $\gamma$ is the gyromagnetic constant of a material in said examination subject which emits said magnetic resonance signal.

4. A magnetic resonance tomography apparatus as claimed in claim 1 wherein said control computer interpolates respective values for unshifted locations of said examination subject in measurement cycles having a gradient magnetic field which changes in the first order, and the shift of the location for each coding step due to the change in the quadratic field strength of said gradient magnetic field.

5. A magnetic resonance tomography apparatus as claimed in claim 4 wherein said control computer operates said radio frequency system and said gradient coils to perform an imaging sequence selected from the group consisting of echo planar imaging and spiral imaging.

6. A magnetic resonance tomography apparatus as claimed in claim 1 wherein said control computer determines values corresponding to unshifted locations of said coding steps by executing additional measurements in a measurement cycle having a changing field strength of the first order of said gradient magnetic field, and the shift of the location for the coding steps due to the change of the quadratic field strength of said gradient magnetic field.

7. A magnetic resonance tomography apparatus as claimed in claim 6 wherein said control computer operates said radio frequency system and said gradient coils to perform an imaging sequence selected from the group consisting of echo planar imaging and spiral imaging.

8. A method for location coding in a magnetic resonance tomography apparatus, comprising the steps of:
   generating a basic magnetic field in a basic magnetic field direction;
   superimposing at least one gradient magnetic field on said basic magnetic field transversely to a coding direction that coincides with said basic magnetic field direction, to produce an overall magnetic field in said coding direction having a magnetic field strength with a component changing quadratically over distance;
   displacing an examination subject by a distance $\Delta w$ in said coding direction in said overall magnetic field;
   exciting nuclear spins in said examination subject and receiving magnetic resonance signals arising from said spins, each of said magnetic resonance signals having a phase and a resonant frequency; and
   in a computer, determining a quadratic change in at least one of differences in said phase and differences in said resonant frequency which occur due to said overall magnetic field component changing quadratically over distance during the displacement of said subject by said distance $\Delta w$, and determining, from said quadratic change, an absolute location L of a magnetic resonance signal in said coding direction.

9. A method as claimed in claim 8 comprising measuring said quadratic change as a change of a quadratic component approximated by $G_r^2 w^2/2 B_0$, wherein $G_r$ is the magnetic field strength of the first order of the gradient magnetic field, w is location, and $B_0$ is the basic magnetic field strength.

10. A method as claimed in claim 9 comprising successively displacing said subject and implementing phase coding by determining $N_z$ different measured values during the respective displacements of said subject, and controlling reception of said magnetic resonance signals so that, after each displacement, an echo time $T_E$ associated with said magnetic resonance signal is allowed to pass and the location w of the magnetic resonant signal is identified from said differences in said phase corresponding to $N_z/\gamma w = G_r^2 W T_E/B_0$, wherein $\gamma$ is the gyromagnetic constant of a material in said examination subject which emits said magnetic resonance signal.

11. A method as claimed in claim 8 comprising interpolating respective values for unshifted locations of said examination subject in measurement cycles having a gradient magnetic field which changes in the first order, and the shift of the location for each coding step due to the change in the quadratic field strength of said gradient magnetic field.

12. A method as claimed in claim 11 comprising obtaining said magnetic resonance signals in an imaging sequence selected from the group consisting of echo planar imaging and spiral imaging.

13. A method as claimed in claim 8 comprising determining values corresponding to unshifted locations of said coding steps by executing additional measurements in a measurement cycle having a changing field strength of the first order of said gradient magnetic field, and the shift of the location for the coding steps due to the change of the quadratic field strength of said gradient magnetic field.

14. A method as claimed in claim 13 comprising obtaining said magnetic resonance signals in an imaging sequence selected from the group consisting of echo planar imaging and spiral imaging.

* * * * *